United States Patent
D'Avino et al.

(10) Patent No.: US 10,284,148 B2
(45) Date of Patent: May 7, 2019

(54) RF AMPLIFIER

(71) Applicant: NXP B.V., Eindhoven (NL)

(72) Inventors: Marco D'Avino, Delft (NL); Mark Pieter van der Heijden, Eindhoven (NL); Michel Wilhelmus Arnoldus Groenewegen, Malden (NL); Leonardus Cornelis Nicolaas de Vreede, Pijnacker (NL)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 15/865,145

(22) Filed: Jan. 8, 2018

(65) Prior Publication Data

US 2018/0198420 A1  Jul. 12, 2018

(30) Foreign Application Priority Data

Jan. 9, 2017  (EP) .................................. 17150707

(51) Int. Cl.
*H03F 1/07* (2006.01)
*H03F 1/32* (2006.01)
(Continued)

(52) U.S. Cl.
CPC ............. *H03F 1/32* (2013.01); *H03F 1/3205* (2013.01); *H03F 3/195* (2013.01); *H03F 3/213* (2013.01);
(Continued)

(58) Field of Classification Search
CPC ................................. H03F 1/07; H03F 1/0288
(Continued)

(56) References Cited

U.S. PATENT DOCUMENTS

| 4,472,687 A * | 9/1984 | Kashiwagi ............ H03F 1/0227 330/263 |
| 4,584,536 A * | 4/1986 | Adachi ................... H04S 7/302 330/124 R |

(Continued)

FOREIGN PATENT DOCUMENTS

EP  1978635 A1  10/2008

OTHER PUBLICATIONS

Gilbert, Barrie; "The Multi-tanh Principle: A Tutorial Overview"; IEEE Journal of Solid-State Circuits, vol. 33, No. 1; 16 page (Jan. 1998).

(Continued)

*Primary Examiner* — Henry Choe

(57) ABSTRACT

An RF amplifier is described including an input, an output, a parallel arrangement of a first branch and at least one further branch, each branch comprising a bipolar transistor in a degenerative emitter configuration having a base coupled to the input, a collector coupled to a common collector node, and an emitter degeneration impedance arranged between the emitter and a common rail. The common collector node is coupled to the output, the base of the first branch bipolar transistor is biased at a first bias voltage and the base of the at least one further branch bipolar transistor is biased at a bias voltage offset from the first bias voltage. In operation of the RF amplifier a IM3 distortion current output by the first branch bipolar transistor is in antiphase to a IM3 distortion current output by the at least one further branch bipolar transistor.

15 Claims, 7 Drawing Sheets

(51) Int. Cl.
*H03F 3/195* (2006.01)
*H03F 3/213* (2006.01)

(52) U.S. Cl.
CPC .. *H03F 2200/225* (2013.01); *H03F 2200/366* (2013.01); *H03F 2200/391* (2013.01); *H03F 2200/402* (2013.01); *H03F 2200/42* (2013.01); *H03F 2200/451* (2013.01); *H03F 2200/498* (2013.01); *H03F 2200/75* (2013.01)

(58) Field of Classification Search
USPC .......................................... 330/295, 124 R
See application file for complete search history.

(56) References Cited

U.S. PATENT DOCUMENTS

| | | | | |
|---|---|---|---|---|
| 6,727,761 | B1* | 4/2004 | Apel | H03F 1/302 |
| | | | | 330/295 |
| 6,744,322 | B1 | 6/2004 | Ma et al. | |
| 6,927,625 | B2* | 8/2005 | Yamaguchi | H01L 24/49 |
| | | | | 330/124 R |
| 7,161,433 | B2* | 1/2007 | Ueda | H03F 1/32 |
| | | | | 330/295 |
| 7,286,018 | B2* | 10/2007 | Makihara | H03F 1/302 |
| | | | | 330/295 |
| 7,548,118 | B2* | 6/2009 | Ariie | H03F 3/189 |
| | | | | 330/295 |
| 7,570,935 | B2 | 8/2009 | Na et al. | |
| 7,696,828 | B2 | 4/2010 | Chang | |
| 8,130,041 | B2* | 3/2012 | Kim | H03F 1/0261 |
| | | | | 330/124 R |
| 2002/0113650 | A1 | 8/2002 | Kim et al. | |
| 2006/0261897 | A1* | 11/2006 | Enomoto | H03F 1/30 |
| | | | | 330/295 |
| 2008/0242257 | A9 | 10/2008 | Aparin | |
| 2009/0174481 | A1 | 7/2009 | Chang | |
| 2011/0018635 | A1 | 1/2011 | Tasic et al. | |

OTHER PUBLICATIONS

Van der Heijden, Mark; "RF Amplifier Design Techniques for Linearity and Dynamic Range", PhD thesis, Chapter 4, Technical University Delft, Netherlands; (Jun. 2005).

D'Avino, Marco; "IM3 Linearity Improvement Techniques for Bipolar Power Amplifiers" Thesis, Master of Science, Technical Univeristy Delft, Notherlands; 133 pages (Nov. 2016).

* cited by examiner

RF AMPLIFIER

CROSS-REFERENCE TO RELATED APPLICATIONS

This application claims the priority under 35 U.S.C. § 119 of European patent application no. 17150707.2, filed Jan. 9, 2017 the contents of which are incorporated by reference herein.

This disclosure relates to Radio-Frequency (RF) Amplifiers implemented with bipolar transistors.

RF amplifiers typically have components with non-linear behaviour which may result in distortion of an incoming signal due to unwanted harmonics resulting from the mixing of different frequencies. In particular third-order intermodulation distortion (IM3) in bipolar amplifiers is harmful as it causes interference with the adjacent transmission channels. This distortion may be significant due to the exponential voltage-to-current transfer of bipolar devices. The IM3 distortion in general is caused by direct mixing of the input components through the third-order power-series coefficient, denoted K3, of the exponential nonlinearity, and indirect mixing of the input components with the second-order components at baseband (IM2) and $2^{nd}$ harmonic (HD2) frequencies.

Techniques have been proposed to reduce the effect of the IM3 distortion to linearize the behaviour of an RF amplifier. For example in "RF Amplifier Design Techniques for Linearity and Dynamic Range" PhD thesis M. P. van der Heijden, published 2005, TU Delft. Out-of-Band matching makes use of both direct and indirect mixing to obtain the IM3 cancellation and can use a single common-emitter (CE) stage. However it is still desirable to further improve the linearity of RF bipolar amplifiers.

Various aspects of the disclosure are defined in the accompanying claims. In a first aspect there is defined an RF amplifier comprising an input, an output, a parallel arrangement of a first branch and at least one further branch, each branch comprising a bipolar transistor in a degenerative emitter configuration having a base coupled to the input, a collector coupled to a common collector node, and an emitter degeneration impedance arranged between the emitter and a common rail; wherein the common collector node is coupled to the output, the base of the first branch bipolar transistor is biased at a first bias voltage and the base of the at least one further branch bipolar transistor is biased at a bias voltage offset from the first bias voltage and wherein in operation a IM3 distortion current output by the first branch bipolar transistor is in antiphase to a IM3 distortion current output by the at least one further branch bipolar transistor.

In embodiments, the RF amplifier may further comprise a resonant circuit coupled between the input and the common rail. The resonant circuit comprises a series arrangement of an inductance and a capacitance. The inductance and capacitance may have a variable value.

In embodiments, the common rail may be a ground.

In embodiments of the RF amplifier, the value of the respective emitter degeneration impedance in each branch is within 10 percent of the ratio of the transit time and the base emitter junction capacitance of the respective bipolar transistor, and wherein the phase of the IM3 distortion current is independent of the bias voltage.

In embodiments of the RF amplifier, each branch may comprise a capacitance arranged between the base of the bipolar transistor and the emitter of the bipolar transistor and wherein the phase of the IM3 distortion current is independent of the bias voltage.

In embodiments of the RF amplifier, the emitter degeneration impedance in each branch may comprise a resistance in parallel with a capacitance and wherein the phase of the IM3 distortion current is independent of the bias voltage.

In embodiments of the RF amplifier, each of the first branch and the at least one further branch may further comprise an AC coupling capacitor arranged between the input and the respective base of the first branch and at least one further branch bipolar transistors.

Embodiments of the RF amplifier may further comprise an output stage comprising a RF choke arranged between a supply rail and the common collector node, and a capacitance arranged between the common collector node and the output.

In embodiments of the RF amplifier, the bipolar transistors may be NPN transistors.

In embodiments of the RF amplifier, each branch may comprise a respective bias circuit coupled to the base of the respective bipolar transistor and wherein the bias circuit comprises a gyrator.

The gyrator may comprise a NPN bipolar transistor, a first resistance arranged between a supply voltage rail and the collector, a second resistance arranged between the collector and the base and a capacitance arranged between the base and a ground rail.

Embodiments of the RF amplifier may further comprise a common-base stage comprising a bipolar transistor having an emitter coupled to the common collector node, a collector coupled to the amplifier output, and a base connected to a common-base bias circuit.

In embodiments, the RF amplifier may comprise a first common-base stage comprising a first common-base stage bipolar transistor having an emitter coupled to the first branch, a collector coupled to the common collector node, and a base connected to a common-base bias circuit, and at least one further common-base stage comprising at least one further common-base stage bipolar transistor having an emitter coupled to the at least one further branch, a collector coupled to the common collector node, and a base connected to the common-base bias circuit.

Embodiments of the RF amplifier may be configured as a class A or class AB amplifier.

Embodiments of the RF amplifier may be included in wireless local area network (WLAN) receivers.

BRIEF DESCRIPTION OF DRAWINGS

In the figures and description like reference numerals refer to like features. Embodiments are now described in detail, by way of example only, illustrated by the accompanying drawings in which:

FIG. 1 shows a RF amplifier 100 which includes an input 106, an output 110, and a first amplifier branch 102a arranged in parallel with a second amplifier branch 102b. The first amplifier branch 102a and second amplifier branch 102b may also be referred to as a common-emitter (CE) stage.

Figure 1:
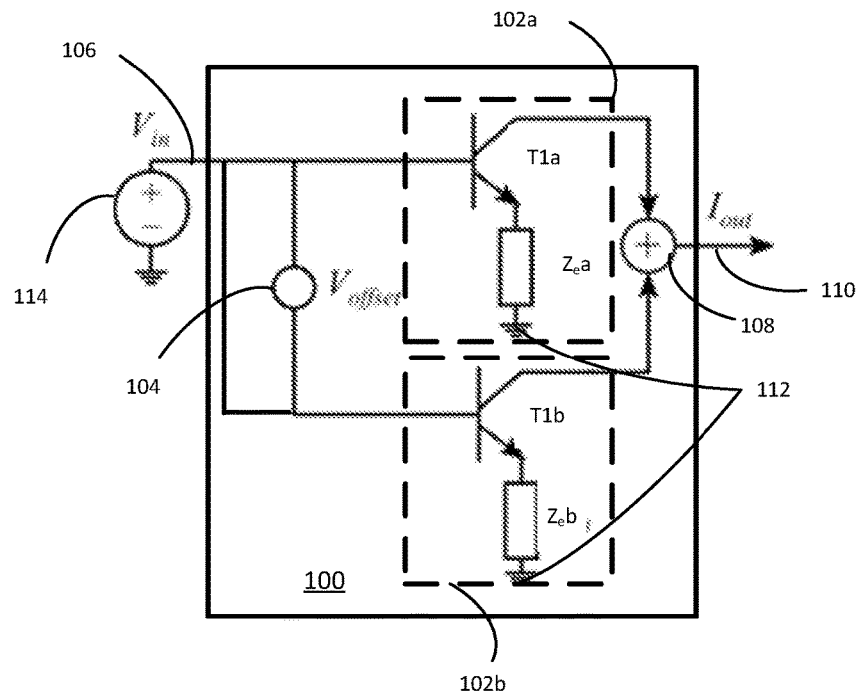
FIG. 1 shows a RF bipolar amplifier according to an embodiment.

The first amplifier branch 102a includes a first bipolar NPN transistor T1a arranged in a degenerative emitter configuration together with a first emitter degeneration impedance $Z_e a$. The base of the bipolar NPN transistor T1a may be connected to the input 106. The emitter of the first bipolar NPN transistor T1a may be connected to a first terminal of the emitter degeneration impedance $Z_e a$. A second terminal of the emitter degeneration impedance $Z_e a$ may be connected to a common rail 112 which may be a ground. The collector of the bipolar NPN transistor T1a may be connected to a common collector node 108.

The second amplifier branch 102b includes a second bipolar NPN transistor T1b arranged in a degenerative emitter configuration together with a second emitter degeneration impedance $Z_e b$. The base of the second bipolar NPN transistor T1b may be connected to the input 106. The emitter of the second bipolar NPN transistor T1b may be connected to a first terminal of the emitter degeneration impedance $Z_e b$. A second terminal of the emitter degeneration impedance $Z_e b$ may be connected to a common rail 112 which may be a ground. The collector of the bipolar NPN transistor T1b may be connected to the common collector node 108.

The common collector node 108 may be connected to the amplifier output 110. A bias circuit 104 may be connected to the base of the first bipolar transistor T1a and the second bipolar transistor T1b.

In operation, the RF amplifier 100 may receive a signal on the input from a signal source 114. The total output current is the sum of the collector currents from the first bipolar transistor T1a and the second bipolar transistor T1b. The bias circuit 104 may bias the bases of the first NPN transistor T1a and the second NPN transistor T1b such that there is a voltage offset between them.

The first NPN transistor T1a and the second NPN transistor T1b are degenerated and biased in such a way that their individual K3 coefficients are equal in magnitude but have opposite sign. In this way, the overall K3 coefficient can be set equal to zero. Note however, that the bases of T1a and T1b need to be terminated in a low impedance at the second-harmonic (H2) and at baseband (IM2) frequencies in order to avoid unwanted IM3 terms from additional indirect mixing at the base-emitter junction.

The nonlinear IM3 currents in the two degenerated CE stages need to have an equal magnitude and opposite phase to achieve an overall IM3 cancellation. To accomplish this over a wide biasing range, the maximum (positive sign) and minimum (negative sign) of the third-order Taylor coefficient as a function of base-emitter voltage has to be found. By biasing the first CE stage for the maximum (positive sign) third-order Taylor coefficient and the other CE stage for the minimum (negative sign) third-order Taylor coefficient, the direct mixing terms may be cancelled if these are made equal in magnitude.

The third-order Taylor coefficient of the emitter-degenerated collector current can be described as:

$$K_{3g} = \frac{g_m(1-2F)}{6V_T^2(1+F)^5}, \tag{1}$$

where $g_m$ is the linear transconductance, $V_T$ is the thermal voltage and F is the multiplication $g_m R_e$. This third-order Taylor coefficient has a maximum for:

$$F_1 = g_{m1} R_{e1} = 0.14 \tag{2}$$

and a minimum for:

$$F_2 = g_{m2} R_{e2} = 1.2 \tag{3}$$

Using (2) and (3) in (1) respectively, the resulting third-order Taylor coefficients of the two CE-stages can be set equal and opposite to each other. This results in the following ratio of transconductance between the two CE-stages for any values of $R_1$ and $R_2$ that satisfy (2) and (3):

$$\frac{g_{m2}}{g_{m1}} = 13.77 \tag{4}$$

When (2), (3) and (4) are valid, the $V_{be}$-$I_c$ relationship approximates a quadratic function for a part of the bias range. By including a degenerative emitter, the principle of derivative superposition to reduce IM3 distortion previously only considered suitable for FET amplifiers may be applied to bipolar RF amplifiers.

At operating frequencies $f_0$ well below $f_T$, typically $f_0 < f_T / \beta$, where $f_T$ is the transition frequency at which the current gain ($\beta$) drops to 1, the transistor displays an approximately ohmic behaviour. At operating frequencies closer to $f_T$ ($f_0 > f_T/\beta$), the diffusion capacitance, resulting from the forward base-emitter transit timer $\tau_f$, and the base-emitter depletion capacitance may also affect the nonlinear third-order intermodulation.

Figure 2:
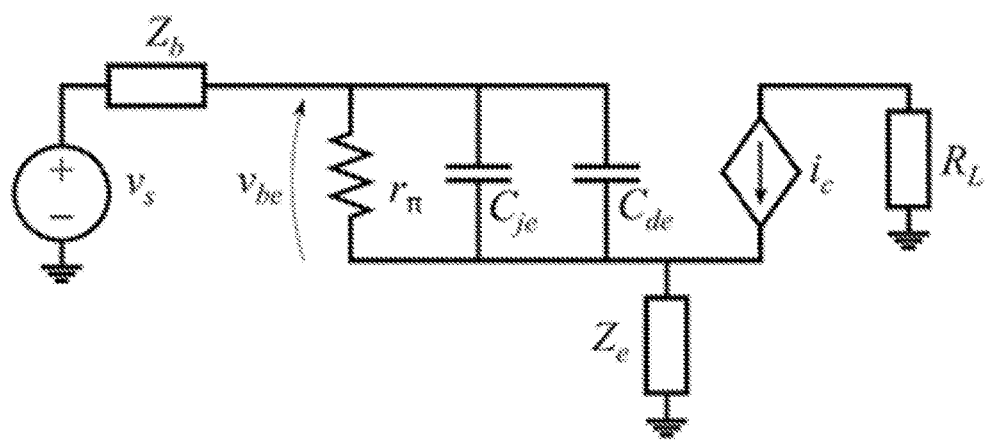
FIG. 2 shows a small signal model of one branch of the RF bipolar transistor of FIG. 1.

FIG. 2 shows a small signal model 150 of one of a single branch common-emitter stage 102a. With reference to FIG. 2, the second order non-linear collector current $i_{c,NL2}$ generated by the exponential base-emitter relation:

$$i_{c,NL2} = K_{2g_m} v_{be}^2 \tag{5}$$

Where $v_{be}$ is the base-emitter voltage and $K_{2g_m}$ is the second-order Taylor coefficient of the exponential collector current to base-emitter voltage relationship.

And the tracking non-linear currents, such as the exponential base current $i_{b,NL2}$ and the capacitive current from the base-emitter diffusion capacitance $i_{C_{de},NL2}$ are respectively:

$$i_{b,NL2} = \frac{i_{c,NL2}}{\beta} \quad (6)$$

$$i_{C_{de},NL2} = s\tau_f i_{c,NL2} \quad (7)$$

Where $\beta$ is the current gain, and $\tau_f$ is the forward base-emitter transit time.

These currents interact with the input terminations and with the base-emitter diffusion and depletion capacitances, generating second-order voltages. This can be described analytically by the function:

$$B(s) = \frac{Z_b/\beta + Z_e + s\tau_f(Z_b + Z_e)}{1 + g_m(Z_b/\beta + Z_e) + sC_\pi(Z_b + Z_e)} \quad (8)$$

Where $C_\pi = C_{de} + C_{je}$ is the total base-emitter capacitance, in which $C_{de} = \tau_f g_m$ is the diffusion capacitance and $C_{je}$ is the depletion capacitance.

B(s) represents the transfer function from the second-order non-linear currents, generated by the exponential distortion, to the second-order base-emitter voltage. This function B(s) may introduce different phase shifts to the second-order voltages, mainly the $2^{nd}$ harmonic voltages, depending on the values of $Z_b$, $Z_e$, and $g_m$. However, if we set the emitter degeneration impedance and the base-emitter junction capacitance, such that:

$$Z_e = \tau_f/C_{je} \quad (9)$$

The zero and the pole of B(s) fall on top of each other, and so no phase shift is introduced. This is true when $Zb/\beta \ll Ze$.

At operating frequencies where $f_o > f_T/\beta$, the IM3 collector currents of the two branches may have different phases, due to the shift introduced by reactive components, such as the base-emitter diffusion and depletion capacitances. Signals that are generated by indirect mixing inside each transistor T1a, T1b, may experience different phase shifts, due to the different operating points of the two transistors.

However, by dimensioning the transistors T1a and T1b and choosing values of $Z_ea$ and $Z_eb$ to satisfy equations (2)-(4), and (9) for both the CE-stage branches 102a, 102b, the two IM3 currents are exactly in anti-phase independent of the biasing of each transistor T1a, T1b. This results in the effective cancellation of the K3 coefficient. This in turn enables the application of the principle of derivative superposition to high frequency bipolar RF amplifiers in order to cancel the direct mixing contribution to the IM3 current. As equations (1) to (9) are based on an idealized model of the transistor, in practice values within 10% of those predicted by the model may also cancel the direct mixing contribution to the IM3 current. At the same time, unwanted IM3 terms generated by indirect mixing at the base may be reduced by zeroing the input voltage in the out-of-band frequencies by proper low-impedance terminations at the second harmonic (H2) and baseband (IM2) frequencies.

Figure 3:
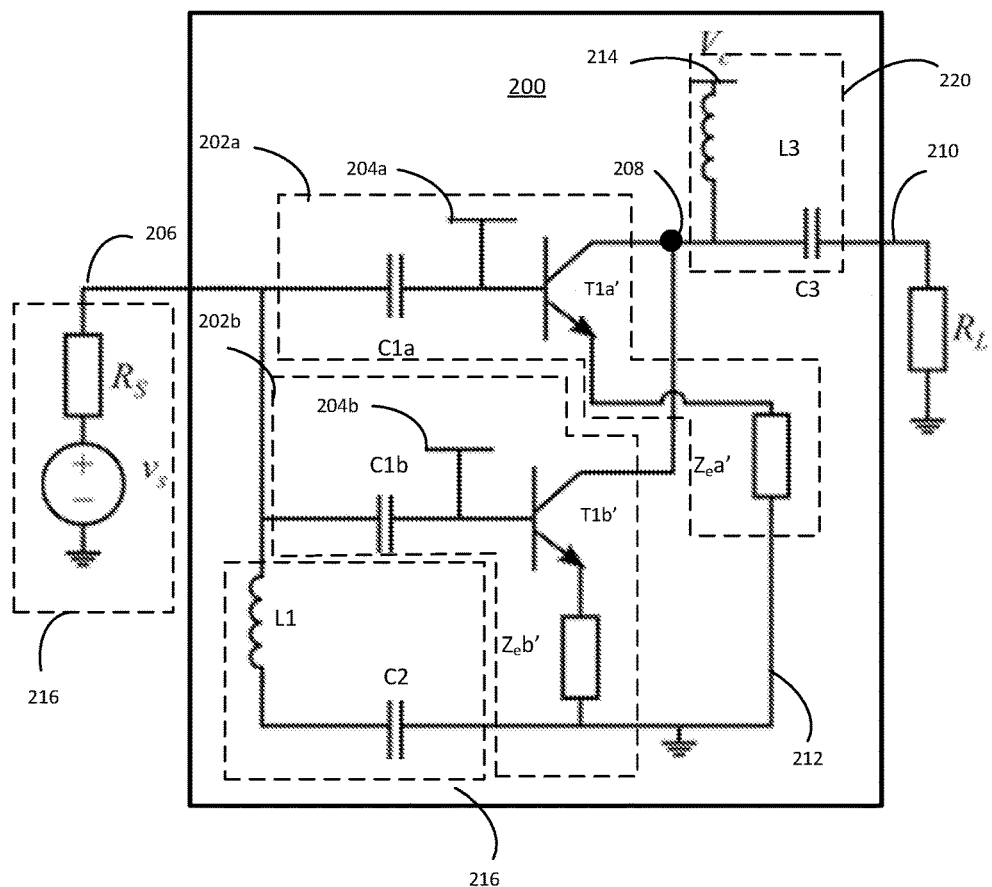
FIG. 3 illustrates a RF bipolar amplifier according to an embodiment.

FIG. 3 shows a RF amplifier 200 according to an embodiment. A first amplifier branch or CE-stage 202a includes a first bipolar NPN transistor T1a' arranged in a degenerative emitter configuration together with a first emitter degeneration impedance $Z_e$a', and an AC coupling capacitor C1a. An input 206 may be connected to a first terminal of an AC coupling capacitor C1a. The base of the bipolar NPN transistor T1a' may be connected to a second terminal of the AC coupling capacitor C1a. The base of the bipolar NPN transistor T1a' may be connected to a first bias supply rail 204a. The emitter of the first bipolar NPN transistor T1a' may be connected to a first terminal of the emitter degeneration impedance $Z_e$a'. A second terminal of the emitter degeneration impedance $Z_e$a' may be connected to a common rail 212 which may be a ground. The collector of the bipolar NPN transistor T1a' may be connected to a common collector node 208.

A second amplifier branch 202b includes a second bipolar NPN transistor T1b' arranged in a degenerative emitter configuration together with a second emitter degeneration impedance $Z_e$b', and an AC coupling capacitor C1b. An input 206 may be connected to a first terminal of an AC coupling capacitor C1b. The base of the bipolar NPN transistor T1b' may be connected to a second terminal of the AC coupling capacitor C1b. The base of the bipolar NPN transistor T1b' may be connected to a second bias supply rail 204b. The emitter of the second bipolar NPN transistor T1b' may be connected to a first terminal of the emitter degeneration impedance $Z_e$b'. A second terminal of the emitter degeneration impedance $Z_e$b' may be connected to a common rail 212 which may be a ground. The collector of the bipolar NPN transistor T1b' may be connected to a common collector node 208.

An amplifier output stage 220 may include an output AC coupling capacitor C3 and a choke inductance L3. The common collector node 208 may be connected to a first terminal of the output AC coupling capacitor C3. A second terminal of the output AC coupling capacitor C3 may be connected to the amplifier output 210. The choke inductance L3 may be connected between the common collector node 308 and a supply rail 214.

A resonant circuit 216 may include a series arrangement of an inductor L1 and a capacitor C2 connected between the amplifier input 206 and the common rail 212. The inductor L1 and the capacitor C2 may be variable or fixed. In other examples, different components may be used to form a resonant circuit.

In operation, the amplifier input 206 may receive an input signal from a signal source 216 represented by a voltage source Vs in series with a resistance Rs. The amplifier output 210 may be connected to a load represented as a load resistance RL. The total output current provided is the sum of the collector currents from the first bipolar transistor T1a and the second bipolar transistor T1b. The bases of transistors T1a' and T1b' are biased at different voltages applied to the first bias supply rail 204a and 204b by respective bias circuits (not shown). The transistors T1a and T1b may be dimensioned and the values of $Z_e$a' and $Z_e$b' to satisfy the relation of equations (2)-(4), and (9) similarly to the RF amplifier 100.

By using this relation of equations (2)-(4), and (9) for both the branches, the two IM3 currents are exactly in anti-phase, resulting in effective cancellation of the K3 coefficient. Since the IM3 currents are in antiphase, the RF amplifier may have improved linearity as the direct mixing contribution to the IM3 current may be cancelled. At the same time, any unwanted IM3 terms generated by indirect mixing may be removed by zeroing the input voltage in the out-of-band frequencies. For the Baseband frequencies, this may be achieved by using biasing circuits that present a low output impedance $Z_{out}$ to the base node where $$Z_{out} < \frac{|Z_{in}||Z_{source}|}{10},$$

$Z_{in}$ is the input impedance and $Z_{source}$ is the source impedance. In addition, for bipolar amplifiers, second harmonic frequencies may contribute significantly to the unwanted IM3 currents that result from indirect mixing. By connecting the resonant circuit 216 between the input 206 and the common rail 212, the $2^{nd}$ harmonic frequencies at the input 206 may be shorted to the common rail 212. By shorting the $2^{nd}$ harmonic frequencies, the linearity of the bipolar amplifier 200 may be significantly improved. When both baseband and $2^{nd}$ harmonic voltages are nullified, no additional IM3 distortion may be generated by indirect mixing mechanisms.

Figure 4A:
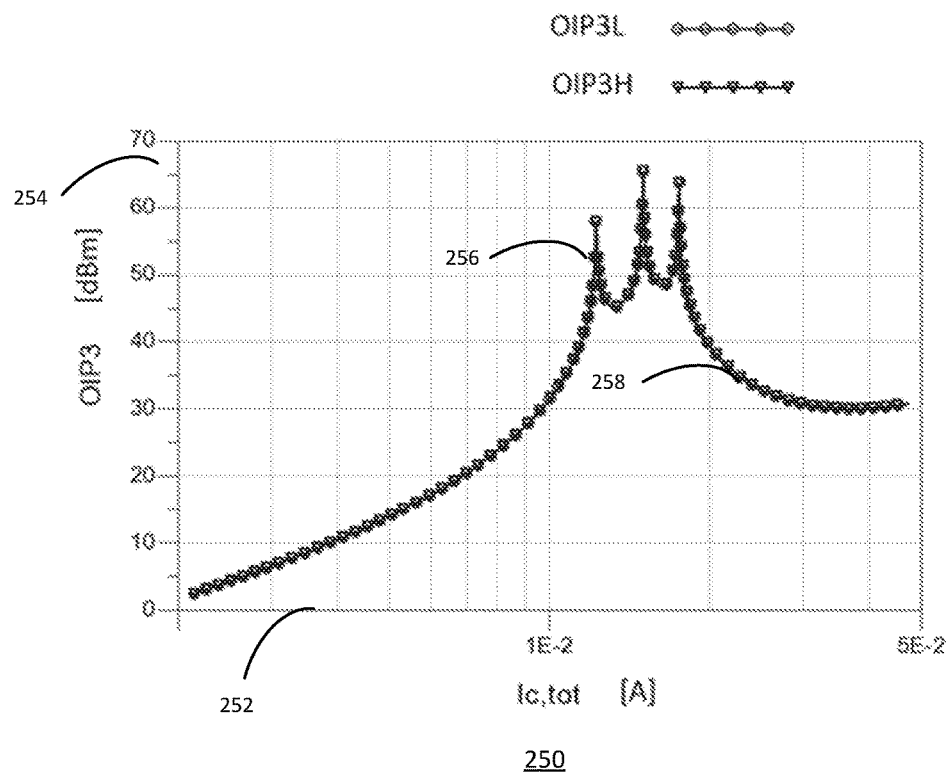
FIG. 4a shows a graph of third-order output power intercept point (OIP3) versus varying bias for the low and high IM3 spectral frequency components for the RF amplifier of FIG. 3.

FIG. 4a shows a graph 250 of the results of simulation of the RF amplifier circuit 200 when a two-tone input frequency is applied. The x-axis 252 shows the quiescent collector bias current on a logarithmic scale in amps up to 50 mA resulting from a sweep of the input biasing voltage. The y-axis 254 is a linear scale showing the value of the third-order output power intercept point (OIP3) in dBm ranging from 0 to 70. The line 256 shows the variation in OIP3 for the higher IM3 harmonic (OIP3H). Line 258 shows the variation in OIP3 for the lower IM3 harmonic (OIP3L). As can be seen the OIP3 variation with biasing current is virtually identical in each case.

Figure 4B:
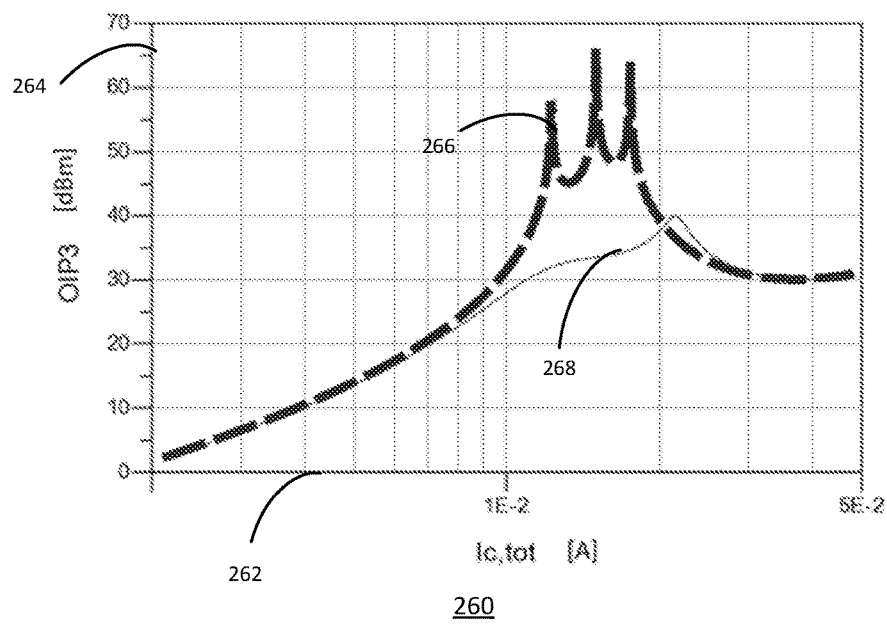
FIG. 4b shows a graph of OIP3 versus varying bias for the low and high IM3 frequency components for a bipolar amplifier with incorrectly dimensioned amplifier branches.

FIG. 4b shows a graph 260 of RF amplifier when the transistors are dimensioned such that the base-emitter depletion capacitance is 20% larger than the optimum value for linearity i.e. $C_{je}=1.2\times\tau_f/Z_e$ and there is no resonant circuit to short the input voltage in the $2^{nd}$ Harmonic band. The x-axis 262 shows the quiescent collector bias current on a logarithmic scale in amps up to 50 mA resulting from a sweep of the input biasing voltage. The y-axis 264 shows the value of the third-order output power intercept point (OIP3) in dBm ranging from 0 to 70. The line 266 shows the variation in OIP3 for the higher IM3 harmonic (OIP3H). Line 268 shows the variation in OIP3 for the lower IM3 harmonic (OIP3L). When the reactive part of the transistors is not compensated, the phases of the two IM3 currents are not aligned, yielding a degradation of the OIP3 figure.

Figure 5:
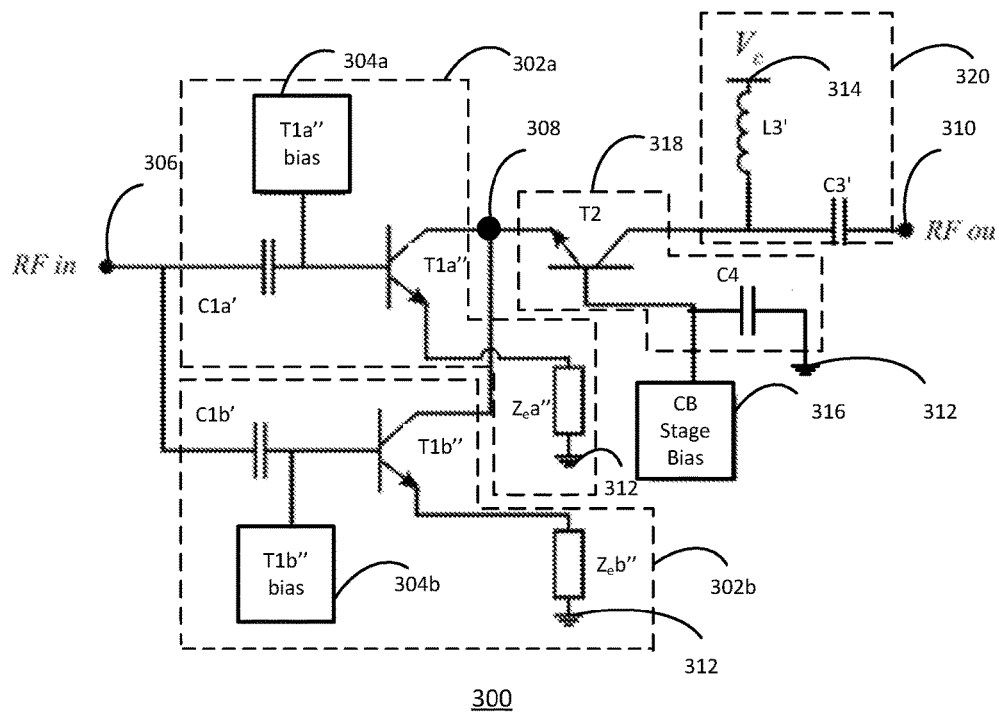
FIG. 5 shows a RF bipolar amplifier according to an embodiment.

FIG. 5 shows a RF amplifier 300 according to an embodiment. A first common-emitter branch 302a may include a first bias circuit 304a, a first bipolar NPN transistor T1a" arranged in a degenerative emitter configuration together with a first emitter degeneration impedance $Z_e$a", and an AC coupling capacitor C1a'. An amplifier input 306 may be connected to a first terminal of an AC coupling capacitor C1a'. The base of the bipolar NPN transistor T1a" may be connected to a second terminal of the AC coupling capacitor C1a'. The base of the bipolar NPN transistor T1a" may be connected to the first bias circuit 304a. The emitter of the first bipolar NPN transistor T1a" may be connected to a first terminal of the emitter degeneration impedance $Z_e$a". A second terminal of the emitter degeneration impedance $Z_e$a" may be connected to a common rail 312 which may be a ground. The collector of the bipolar NPN transistor T1a" may be connected to a common collector node 308.

A second common-emitter branch 302b may include a second bipolar NPN transistor T1b" arranged in a degenerative emitter configuration together with a second emitter degeneration impedance $Z_e$b", and an AC coupling capacitor C1b'. The amplifier input 306 may be connected to a first terminal of an AC coupling capacitor C1b'. The base of the bipolar NPN transistor T1b" may be connected to a second terminal of the AC coupling capacitor C1b. The base of the bipolar NPN transistor T1b' may be connected to the second bias circuit 304b. The emitter of the second bipolar NPN transistor T1b" may be connected to a first terminal of emitter degeneration impedance $Z_e$b". A second terminal of the emitter degeneration impedance $Z_e$b" may be connected to a common rail 312 which may be a ground. The collector of the bipolar NPN transistor T1b' may be connected to a common collector node 308.

A common-base (CB) stage 318 may include a third NPN transistor T2, and a capacitor C4. The common collector node 308 may be connected to an emitter of a third NPN transistor T2. The collector of the third NPN transistor T2 may be connected to a first terminal of an output AC coupling capacitor C3'. A second terminal of the output AC coupling capacitor C3' may be connected to the amplifier output 310. A choke inductance L3' may be connected between the collector of the third NPN transistor T2 and a supply rail 314. A common-base bias circuit 316 may be connected to the base of the third NPN transistor T2. The capacitor C4 may be connected between the base of the third NPN transistor T2 and the ground rail 312 to short the fundamental frequency. Bias circuit 316 for the common-base stage transistor T2 may be wide-band and low-ohmic output impedance which may be implemented for example using an emitter-follower circuit.

In operation, the amplifier input 306 may receive an input signal. The total output current is the sum of the collector currents from the first bipolar transistor T1a" and the second bipolar transistor T1b". The bases of transistors T1a" and T1b" are biased at different voltages applied by respective bias circuits 304a, 304b. The transistors T1a" and T1b" are dimensioned and the values of $Z_e$a" and $Z_e$b" chosen to satisfy the relation of equation 9 similarly to the RF amplifiers 100, 200. In other examples a resonant circuit may be connected between the input 306 and the common rail 312 to short the $2^{nd}$ Harmonic frequencies.

The cascode configuration obtained by adding the third transistor T2 reduces the feedback effect of the base-collector capacitance ($C_{bc}$) of the two transistors T1a", T1b", which ensures the output collector currents are actually summed at the common collector node 308. At the same time, the transistor T2 configured as a common-base stage, can sustain a higher output voltage swing due to the cascode arrangement, resulting in a higher peak output power.

By using the relation of equation 9 for both the branches, the two IM3 currents are exactly in anti-phase, resulting in effective cancellation of the K3 coefficient. Consequently the direct mixing contribution to the IM3 current is cancelled, which may improve the linearity of the amplifier. At the same time, the IM3 terms generated by indirect mixing at the base of T1a" and T1b" at the out-of-band frequencies may be reduced, by zeroing the input voltage at the out-of-band frequencies. This may further improve the linearity of the RF amplifier. For the Baseband frequencies, this may be achieved for example by using the biasing circuits shown in FIGS. 6a and 6b which implements a gyrator to create an active inductor circuit. The gyrator requires a smaller chip area than a physical inductor.

Figure 6A:
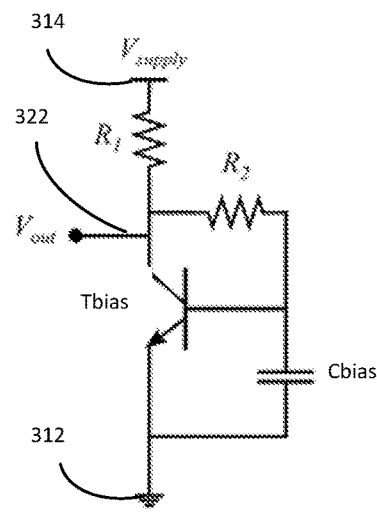
FIG. 6a illustrates an example bias circuit used in a common-emitter stage.

FIG. 6a shows a biasing circuit 320. A first resistance R1 may be connected between a supply rail 314 and the collector of a NPN bias transistor Tbias. A second resistance R2 may be connected between the collector and base of the bias transistor Tbias. A capacitance Cbias may be connected between the base of the bias transistor Tbias and a ground rail 312. The collector of the bias transistor Tbias is connected to the bias circuit output 322.

This circuit implements a gyrator. The output impedance can be written as:

$$Z_{out} = \frac{1 + sCR_2}{g_M + sC} \quad (10)$$

where $C=C_{bias}+C_{be}$, where $C_{be}$ is the base-to-emitter capacitance of Tbias. The impedance offered at DC and baseband is: $Z_{out,LF} \approx 1/g_m$, which can be made very low by increasing the amount of DC current. In this way, the requirement to short the input nodes at baseband frequencies is accomplished.

At the same time, it provides isolation from the RF circuit path by offering a high output impedance at RF: assuming: $R_2 >> 1/g_m \rightarrow Z_{out,RF} \approx sR_2C/g_m$ (inductive)

The bias circuit 320 may be used to implement bias circuits 304a and 304b. As will be appreciated, different values of the components R1, R2, Cbias may be used in the bias circuits 304a and 304b to set the proper biasing point.

The bias circuit 320 has an important advantage over the use of an inductor for biasing purposes: when two or more transistors are used to implement the RF amplifiers, bias circuit 350 occupies a much lower die area, and the biasing circuitry can be positioned on-chip, very close to the RF circuitry. Moreover, bias circuit 320 provides on-chip baseband decoupling for the input of the amplifier.

Figure 6B:
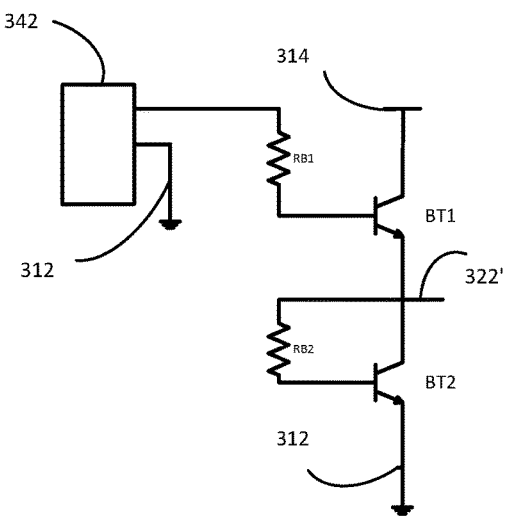
FIG. 6b shows an example bias circuit used in a common-emitter stage.

FIG. 6b shows a biasing circuit 340 which also implements a gyrator. A first resistance RB1 is connected between a voltage reference 342 and the base of a first bias transistor BT1, the collector of the first bias transistor BT1 is connected to a supply rail 314. The emitter of the first bias transistor BT1 is connected to the bias circuit output 322'. A second bias resistor RB2 is connected between the base of the second bias transistor BT2 and the bias circuit output 322'.

When connected to a CE stage, transistor BT1 may conduct current to cancel avalanche current generated in the CE stage, which will predominantly occur under load mismatch conditions. Transistor BT1 may provide the exact amount of base current needed by a connected CE stage, without wasting power when a low signal amplitude is present. The value of the resistors RB1 and RB2 are chosen in such a way that together with the base-to-emitter capacitances of BT1 and BT2 they prevent unwanted RF currents in these transistors, thereby eliminating the need for any inductors similarly to the gyrator circuit 320. Other bias circuits which may be used for biasing the common-emitter stages are described in European patent application 16177378.3.

Figure 7:
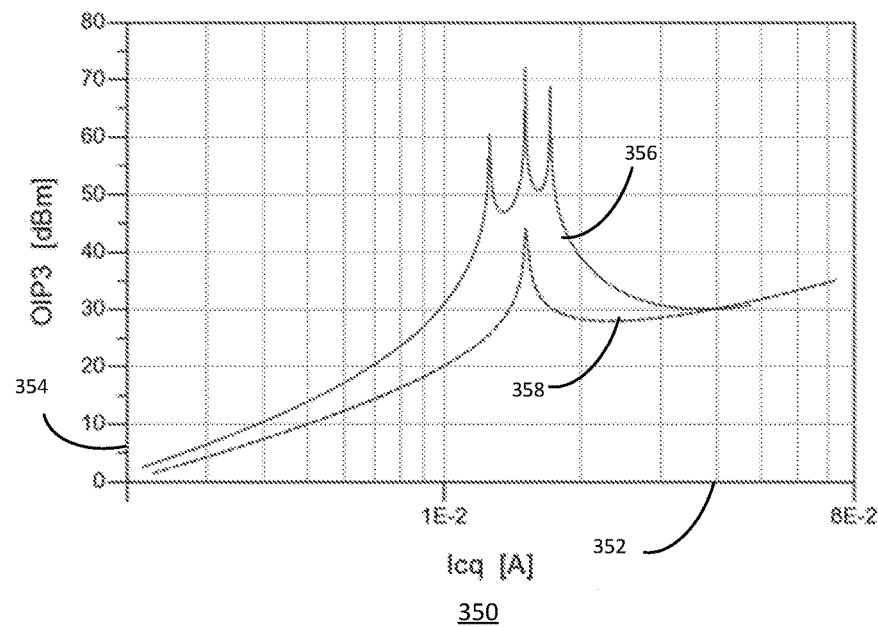
FIG. 7 shows a comparison of OIP3 versus varying bias for the RF amplifier of FIG. 3 and a known RF amplifier with out-of-band matching for improved linearization.

FIG. 7 shows a graph 360 of the OIP3 performance for the RF amplifier 300 compared to an RF bipolar amplifier using only out-of-band matching when a two-tone input frequency is applied. The x-axis 362 shows the biasing quiescent collector current on a logarithmic scale in amps up to 80 mA resulting from a sweep of the input biasing voltage. The y-axis 364 is a linear scale showing the value of the third-order output power intercept point (OIP3) in dBm ranging from 0 to 80. The line 366 shows the variation in OIP3 for RF power amplifier 300. Line 408 shows the variation in OIP3 for the known RF amplifier. As can be seen, the OIP3 value is higher for the RF power amplifier 300 for bias current levels below approximately 4 mA.

Figure 8:
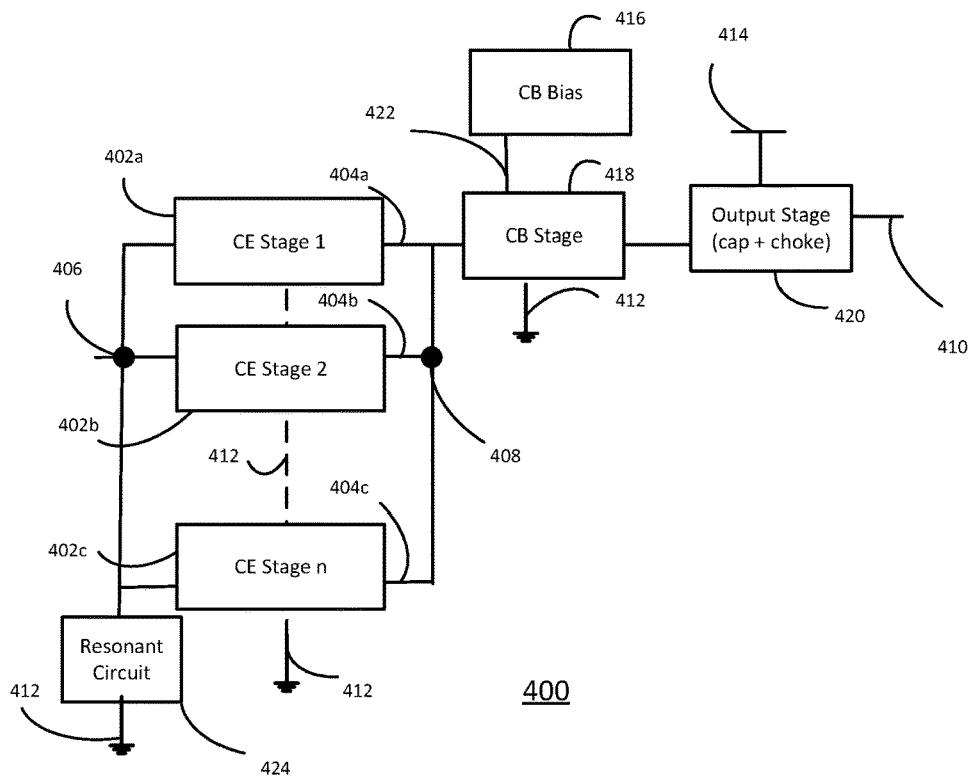
FIG. 8 shows a RF bipolar amplifier according to an embodiment.

FIG. 8 shows a RF amplifier 400 which includes multiple common-emitter stages or branches. An amplifier input 406 may be connected to a first CE stage 402a, a second CE stage 402b and an $n^{th}$ CE stage 402c. A resonant circuit 424 may be connected between the amplifier input 406 and a ground 412.

The ground 412 may also be connected to each of the CE stages 402a, 402b and 402c. The outputs of each of the CE stages 404a, 404b, and 404c may be connected to the common collector node 408 and an input to a common-base stage 418. The common-base stage 418 output may be connected to an output stage 420. The output stage 420 may be connected to the supply rail. The output stage may be connected the amplifier output 410. The RF amplifier may cancel the third-order harmonic distortion by biasing each of the second CE stage 402b to $n^{th}$ CE stage 402c such that the IM3 distortion currents are in antiphase to the IM3 distortion current of the first CE stage 402a as described earlier for the RF amplifiers 100, 200 and 300. By including more CE stages biased at different operating points, the IM3 distortion due to direct mixing may be reduced over a wider range of bias voltages then for just two CE stages. The CB stage 418 may allow operation at higher voltages as described for RF amplifier 300. The resonant circuit 424 may cancel $2^{nd}$ harmonic distortion components by shorting the input voltage as described for RF amplifier 200.

Figure 9:
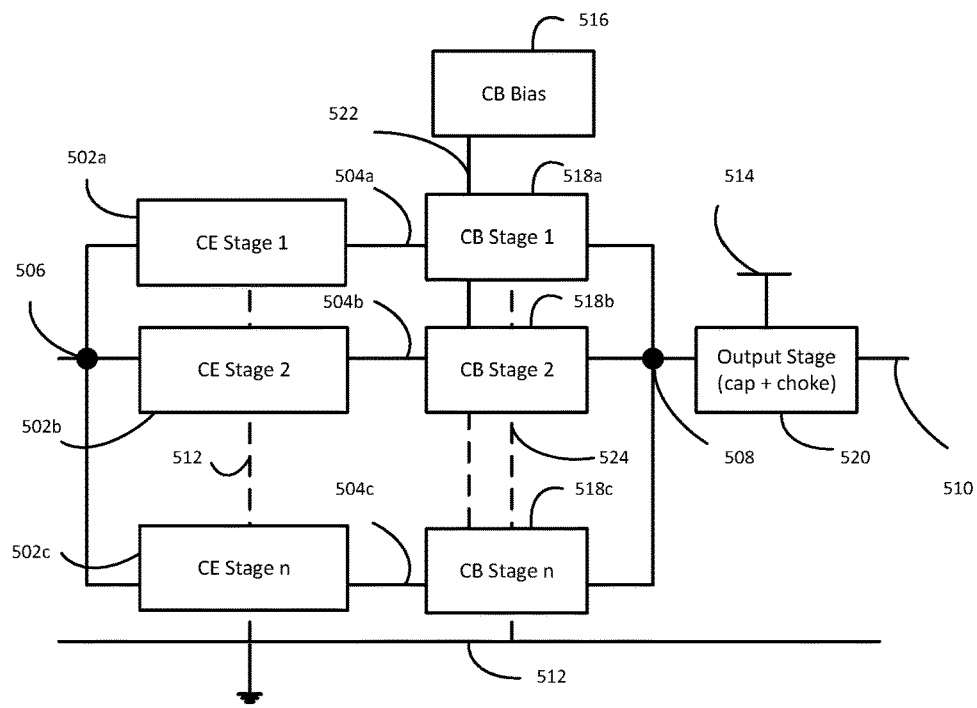
FIG. 9 illustrates a RF bipolar amplifier according to an embodiment.

FIG. 9 shows a RF amplifier 500 which includes multiple common-emitter stages and multiple common-base stages. An amplifier input 506 may be connected to a first CE stage 502a, a second CE stage 502b and an $n^{th}$ CE stage 502c. The ground 512 may also be connected to each of the CE stages 502a, 502b and 502c. The outputs of each of the CE stages 504a, 504b, and 504c may be connected to the input of a respective common-base stage 518a, 518b, and 518c. The outputs of each of the common-base stages 518a, 518b, and 518c may be connected to a common collector node 508 and the output stage 520. The output stage 520 may be connected to the supply rail 514. The output stage 520 may be connected the amplifier output 510. The RF amplifier 500 may cancel the third-order harmonic distortion by biasing each of the second CE stage 502b to $n^{th}$ CE stage 502c such that the IM3 distortion currents are in antiphase to the IM3 distortion current of the first CE stage 502a as described earlier for the RF amplifiers 100, 200 and 300. By including more CE stages biased at different operating points, the IM3 distortion due to direct mixing may be reduced over a wider range of bias voltages then for just two CE stages. The CB stages 518a, 518b, 518c may allow operation at higher voltages as described for RF amplifier 300 and the collector currents are summed after the CB stages. The advantage of such an arrangement is that each CB stage can be properly scaled per branch with respect to the bias current operating point of its respective CE stage. This may result in a more balanced load of the different CE stages or branches which may further improve the linearity of the RF amplifier.

Figure 10:
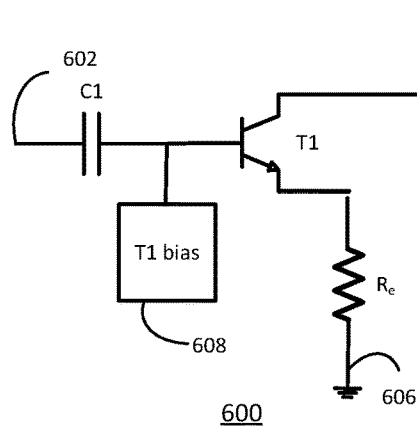
FIG. 10a illustrates an example common-emitter stage used in embodiments of the RF bipolar amplifier.
FIG. 10b illustrates an example common-emitter stage used in embodiments of the RF bipolar amplifier.
FIG. 10c illustrates an example common-emitter stage used in embodiments of the RF bipolar amplifier.
FIG. 10d illustrates an example common-base stage used in embodiments of the RF bipolar amplifier.
FIG. 10e illustrates an example output matching stage used in embodiments of the RF bipolar amplifier.
FIG. 10f illustrates an example resonant circuit used in embodiments of the RF bipolar amplifier.
Figure 10:
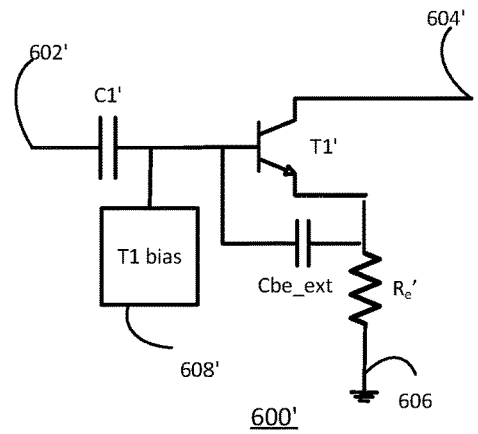
Figure 10:
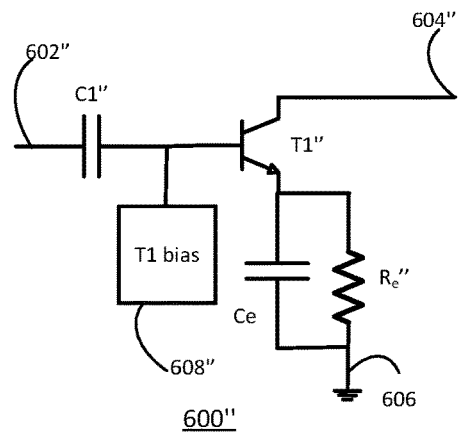
Figure 10:
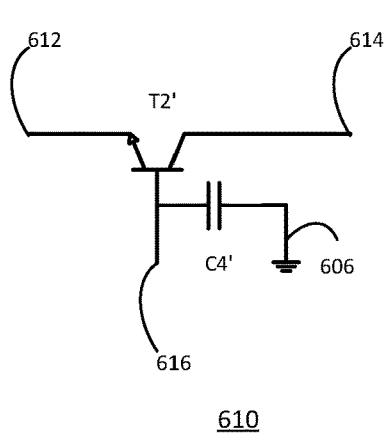
Figure 10:
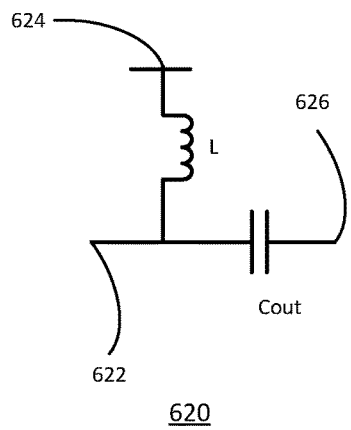
Figure 10:
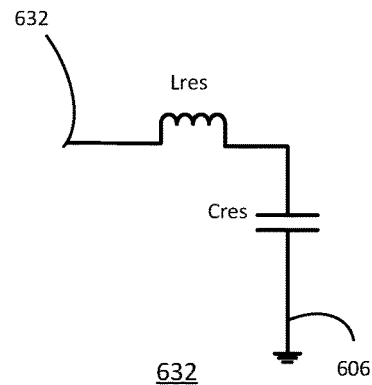

FIG. 10 shows example implementations of the CE stage, CB stage, Resonant circuit, and Output stage which may be used for example in RF amplifiers 400 and 500.

FIG. 10a shows a common-emitter stage 600 including a bias circuit 608, a bipolar NPN transistor T1 arranged in a degenerative emitter configuration together with an emitter degeneration resistance $R_e$, and an AC coupling capacitor C1. The CE stage 600 has an input 602 connected to a first terminal of capacitance C1, a second terminal of capacitance C1 may be connected to the base of NPN transistor T1. The bias circuit 608 may be connected to the base of transistor T1. The collector of transistor T1 may be connected to the output 604 of the CE stage 600. The emitter degeneration resistance $R_e$ may be connected between the emitter of transistor T1 and ground 606. RF amplifier 400 and 500 may use two or more common-emitter stages 600 to reduce IM3 distortion by biasing the transistor in each common-emitter stage differently and dimensioning the respective transistor T1 and resistor Re in each stage according to values that satisfy equation 9 within 10% as described for the RF amplifier 100. This may allow IM3 distortion to be reduced in bipolar RF amplifiers operating at high frequency.

FIG. 10b shows a common-emitter stage 600' including a bias circuit 608', a bipolar NPN transistor T1' arranged in a degenerative emitter configuration together with an emitter degeneration resistance $R_e$, and an AC coupling capacitor C1. The CE stage 600' has an input 602' connected to a first terminal of capacitance C1', a second terminal of capacitance C1' may be connected to the base of NPN transistor T1'. The collector of transistor T1' may be connected to the output 604' of the CE stage 600'. The emitter degeneration resistance $R_e$' may be connected between the emitter of transistor T1' and ground 606. A capacitance Cbe_ext may be connected between the base of transistor T1' and the emitter of transistor T1'. An RF amplifier may use two or more common-emitter stages 600' to reduce IM3 distortion by biasing the transistor in each common-emitter stage differently. Having a degenerative emitter may allow the derivative superposition principle to be used in an RF bipolar amplifier. Alternatively or in addition to dimensioning transistor T1' and resistance Re' according to equation 9, capacitance Cbe_ext may compensate for the different phase delays of the IM3 currents at high frequency ($f_o > f_T/\beta$). This may allow IM3 distortion to be reduced in bipolar RF amplifiers operating at high frequency.

FIG. 10c shows an example common-emitter stage 600" including a bias circuit 608", a bipolar NPN transistor T1" arranged in a degenerative emitter configuration together with an emitter degeneration resistance $R_e$", and an AC coupling capacitor C1". The CE stage 600" has an input 602" connected to a first terminal of capacitance C1", a second terminal of capacitance C1" may be connected to the base of NPN transistor T1". The collector of transistor T1" may be connected to the output 604" of the CE stage 600'. The emitter degeneration resistance $R_e$" may be connected between the emitter of transistor T1" and ground 606. A capacitance Ce may be connected between the emitter of transistor T1" and ground 606. An RF amplifier may use two or more common-emitter stages 600" to reduce IM3 distortion by biasing the transistor in each common-emitter stage differently. Having a degenerative emitter configuration may allow the derivative superposition principle to be used in an RF bipolar amplifier. Alternatively or in addition to dimensioning transistor T1" and resistance Re" according to equation 9, capacitance Ce may compensate for the different phase delays of the IM3 currents at high frequency ($f_o > f_T/\beta$). This may allow IM3 distortion to be reduced in bipolar RF amplifiers operating at high frequency.

FIG. 10d shows an example common-base stage 610 including a transistor T2' and a capacitance C4' connected between the base of transistor T2' and ground 606. Input 612 is connected to the emitter of the transistor T2' and output 614 is connected to the collector of the transistor T2'. The bias input 616 is connected to the base of transistor T2'.

FIG. 10e shows an example output stage 620 including a choke inductance L and AC coupling capacitor Cout. Inductor L is connected between a supply rail 624 and the input 622. The AC coupling capacitor Cout is connected between the input 622 and the output 626. and a capacitance C4' connected between the base of transistor T2' and ground 606.

FIG. 10f shows an example resonance circuit 632 including a series arrangement of an inductance Lres and capacitor Cres between an input 632 and ground 606. Lres and Cres may be fixed or variable.

The circuits and modifications described herein may be applied for the linearization of high frequency RF amplifiers using bipolar devices. The RF amplifiers can be Low-Noise Amplifiers or Power Amplifiers, which are used for the reception and transmission of wireless signals respectively. In particular, RF bipolar amplifiers working in class A or AB, whose overall linearity is (mainly) affected by the exponential distortion. The RF amplifiers may be implemented as integrated circuits using any suitable technology. For example SiGe BiCMOS technology may be used. Example RF amplifiers described herein may be included in wireless LAN transceivers, mobile phones, base stations in cellular networks, and wireless backhaul systems. The RF amplifiers described in the examples use NPN transistors but it will be appreciated that in other examples, PNP bipolar transistors or a combination of PNP and NPN transistors may be used. Some embodiments of the RF amplifiers may operate at frequencies in the range of a few hundred MHz. Some embodiments of the RF amplifiers may operate at frequencies in the range tens of GHz. It will be appreciated that the RF amplifiers described herein may be suitable for amplifying RF signal frequencies greater than a few hundred MHz.

An RF amplifier is described including an input, an output, a parallel arrangement of a first branch and at least one further branch, each branch comprising a bipolar transistor in a degenerative emitter configuration having a base coupled to the input, a collector coupled to a common collector node, and an emitter degeneration impedance arranged between the emitter and a common rail. The common collector node is coupled to the output, the base of the first branch bipolar transistor is biased at a first bias voltage and the base of the at least one further branch bipolar transistor is biased at a bias voltage offset from the first bias voltage. In operation of the RF amplifier a IM3 distortion current output by the first branch bipolar transistor is in antiphase to a IM3 distortion current output by the at least one further branch bipolar transistor.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. An RF amplifier comprising:
   an input,
   an output,
   a parallel arrangement of a first branch and at least one further branch, each branch comprising a bipolar transistor in a degenerative emitter configuration having a base coupled to the input, a collector coupled to a common collector node, and an emitter degeneration impedance arranged between the emitter and a common rail;
   wherein the common collector node is coupled to the output, the base of the first branch bipolar transistor is biased at a first bias voltage and the base of the at least one further branch bipolar transistor is biased at a bias voltage offset from the first bias voltage, and wherein in operation a IM3 distortion current output by the first branch bipolar transistor is in antiphase to a IM3 distortion current output by the at least one further branch bipolar transistor.

2. The RF amplifier of claim 1 further comprising a resonant circuit coupled between the input and the common rail.

3. The RF amplifier of claim 2 wherein the resonant circuit comprises a series arrangement of an inductance and a capacitance.

4. The RF amplifier of claim 3 wherein at least one of the inductance and capacitance has a variable value.

5. The RF amplifier of claim 1 wherein the common rail is a ground.

6. The RF amplifier of claim 1 wherein the value of the respective emitter degeneration impedance in each branch is within 10 percent of the ratio of the transit time and the base emitter junction capacitance of the respective bipolar transistor, and wherein the phase of the IM3 distortion current is independent of the bias voltage.

7. The RF amplifier of claim 1 wherein each branch comprises a capacitance arranged between the base of the bipolar transistor and the emitter of the bipolar transistor and wherein the phase of the IM3 distortion current is independent of the bias voltage.

8. The RF amplifier of claim 1 wherein the emitter degeneration impedance in each branch comprises a resistance in parallel with a capacitance and wherein the phase of the IM3 distortion current is independent of the bias voltage.

9. The RF amplifier of claim 1 wherein each of the first branch and the at least one further branch further comprises an AC coupling capacitor arranged between the input and the respective base of the first branch and the at least one further branch bipolar transistors.

10. The RF amplifier of claim 1 further comprising an output stage comprising a RF choke arranged between a supply rail and the common collector node, and a capacitance arranged between the common collector node and the output.

11. The RF amplifier of claim 1 wherein each branch comprises a respective bias circuit coupled to the base of the respective bipolar transistor and wherein the bias circuit comprises a gyrator.

12. The RF amplifier of claim 11 wherein the gyrator comprises a NPN bipolar transistor, a first resistance arranged between a supply voltage rail and the collector, a second resistance arranged between the collector and the base and a capacitance arranged between the base and a ground rail.

13. The RF amplifier of claim 1 further comprising a common-base stage comprising a bipolar transistor having an emitter coupled to the common collector node, a collector coupled to the amplifier output, and a base connected to a common-base bias circuit.

14. The RF amplifier of claim 1 further comprising:
   a first common-base stage comprising a first common-base stage bipolar transistor having an emitter coupled to the first branch, a collector coupled to the common collector node, and a base connected to a common-base bias circuit, and
   at least one further common-base stage comprising at least one further common-base stage bipolar transistor having an emitter coupled to the at least one further branch, a collector coupled to the common collector node, and a base connected to the common-base bias circuit.

15. The RF amplifier of claim 1 configured as a class A or class AB amplifier.

* * * * *